(12) United States Patent
Sugimoto et al.

(10) Patent No.: US 8,872,166 B2
(45) Date of Patent: Oct. 28, 2014

(54) ORGANIC EL DEVICE

(75) Inventors: Hiroshi Sugimoto, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 140 days.

(21) Appl. No.: 13/497,233

(22) PCT Filed: Jun. 30, 2010

(86) PCT No.: PCT/JP2010/004315
§ 371 (c)(1),
(2), (4) Date: Mar. 20, 2012

(87) PCT Pub. No.: WO2011/064914
PCT Pub. Date: Jun. 3, 2011

(65) Prior Publication Data
US 2012/0181525 A1    Jul. 19, 2012

(30) Foreign Application Priority Data

Nov. 26, 2009  (JP) ................................. 2009-268851

(51) Int. Cl.
*H01L 51/52* (2006.01)
*H01L 27/32* (2006.01)
*H05B 33/12* (2006.01)

(52) U.S. Cl.
CPC ........ *H01L 51/5259* (2013.01); *H01L 27/3246* (2013.01); *H01L 27/3258* (2013.01); *H05B 33/12* (2013.01)
USPC ..................................... 257/40; 257/E51.018

(58) Field of Classification Search
USPC ......... 257/223, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016
See application file for complete search history.

(56) References Cited

U.S. PATENT DOCUMENTS

2005/0110023 A1*  5/2005  Lee et al. ......................... 257/72
(Continued)

FOREIGN PATENT DOCUMENTS

JP    2003332069 A    11/2003
JP    2005141960 A    6/2005
(Continued)

OTHER PUBLICATIONS

International Search Report received for PCT Patent Application No. PCT/JP2010/004315, mailed on Aug. 10, 2010, 5 pages (2 pages of English Translation and 3 pages of PCT Search Report).

*Primary Examiner* — David Vu
*Assistant Examiner* — Jonathan Han
(74) *Attorney, Agent, or Firm* — Morrison & Foerster LLP (57) ABSTRACT

An organic EL device (10) includes: a substrate (11); a planarizing film (12) comprised of an organic resin and provided over the substrate (11) so as to cover a light-emitting region (P) and a non-light-emitting region (N); a first electrode (13) provided on the planarizing film (12) so as to cover at least the light-emitting region (P); an organic layer (14) provided on the first electrode (13) so as to cover at least the light-emitting region (P); and a second electrode (15) provided on the organic layer (14) so as to cover the light-emitting region (P) and the non-light-emitting region (N). A hole (17) is formed in the non-light-emitting region (N) so as to extend from the second electrode (15) to the planarizing film (12), and at least the planarizing film (12) is exposed by an inner wall surface of the hole (17).

10 Claims, 8 Drawing Sheets

(56) References Cited

U.S. PATENT DOCUMENTS

2005/0179374 A1* 8/2005 Kwak .......................... 313/506
2009/0200931 A1   8/2009 Takei et al.
2009/0261720 A1* 10/2009 Shinto ......................... 313/504

FOREIGN PATENT DOCUMENTS

| | | |
|---|---|---|
| JP | 2005164818 A | 6/2005 |
| JP | 2007121537 A | 5/2007 |
| JP | 2009187898 A | 8/2009 |

* cited by examiner

ORGANIC EL DEVICE

CROSS REFERENCE TO RELATED APPLICATIONS

This is a U.S. National Phase patent application of PCT/JP2010/004315, filed Jun. 30, 2010, which claims priority to Japanese Patent Application No. 2009-268851, filed Nov. 26, 2009, each of which is hereby incorporated by reference in the present disclosure in its entirety.

TECHNICAL FIELD

The present invention relates to organic electroluminescence (EL) devices in which degradation in organic EL luminous characteristics is suppressed.

BACKGROUND ART

In recent years, with diversification of information processing apparatuses, there has been a growing demand for flat panel displays having lower power consumption than cathode ray tubes (CRTs) and capable of being reduced in thickness. An organic EL panel is an example of flat panel displays that are advantageous in terms of low voltage drive, all-solid-state type, high-speed response, self light emission, etc. In an organic EL panel, thin film transistors (hereinafter referred to as the "TFTs") are provided on, e.g., a glass substrate, a planarizing film is provided to planarize and insulate the substrate surface, and a first electrode, an organic layer, and a second electrode are sequentially stacked on the planarizing film.

The planarizing film is comprised of an organic resin material such as an acrylic resin or a polyimide resin, in view of the dielectric constant, the film thickness, easiness of planarization, easiness of patterning control, easiness of control of the taper angle at the end of a formed pattern. In particular, the acrylic resin is more advantageous than the polyimide resin in terms of the cost and in terms of the fact that the acrylic resin is a colorless, transparent resin while the polyimide resin is a colored, transparent resin. Thus, the acrylic resin is preferably used as the planarizing film.

These organic resin materials tend to accumulate water, oxygen, etc. therein as compared to materials comprised of an inorganic compound. In particular, the acrylic resin is more hygroscopic than the polyamide resin, and contains a larger amount of water than the polyamide resin. The water contained in the organic resin can be removed in advance by baking. However, for example, since the acrylic resin can resist heat up to about 250° C., the water contained in the acrylic resin cannot be sufficiently removed by the baking performed at a temperature lower than about 250° C. Thus, in the case where the planarizing film is comprised of the organic resin material, water etc. leaks from the planarizing film, and outgas from the planarizing film reaches the electrodes or the organic layer. Accordingly, the peripheral portions of the electrodes or the organic layer are damaged, and luminance is reduced in the degraded portions.

Patent Document 1 discloses a configuration in which inorganic insulating films are respectively provided in the layers located above and below a planarizing film comprised of an organic material. According to Patent Document 1, since the planarizing film is completely covered by the inorganic insulating films, the planarizing film can be prevented from absorbing water during manufacturing of an organic EL device, and degradation of the organic layer by the water can be prevented.

Patent Document 2 discloses an organic EL panel having a configuration in which a planarizing film is divided on a pixel-by-pixel basis by a planarizing-film dividing portion provided in a display region. According to this configuration, even if water leaks from the planarizing film in any of the pixels, the water is not allowed to move to the planarizing films in the other pixels, whereby the water leaking from the polarizing film can be prevented from diffusing in the entire display region.

CITATION LIST

Patent Document

PATENT DOCUMENT 1: Japanese Patent Publication No. 2007-121537
PATENT DOCUMENT 2: Japanese Patent Publication No. 2005-164818

SUMMARY OF THE INVENTION

Technical Problem

However, the organic EL device having the configuration of Patent Document 1 typically does not have satisfactory adhesion between the organic film and the inorganic films, film delamination or cracks may occur during the manufacturing process or while the product is in use. If the inorganic insulating film is damaged (film delamination, cracks, pinholes produced by other causes, etc.), water contained in the planarizing film leaks from the damaged portion. That is, the organic EL device having the configuration of Patent Document 1 does not satisfactorily solve the problems regarding leakage of water etc. contained in the acrylic resin and degradation in organic EL luminous characteristics by outgas from the acrylic resin.

According to the organic EL panel having the configuration of Patent Document 2, the planarizing-film dividing portion can prevent the water contained in each planarizing film from moving in the entire display region. However, since the surface of each of the divided planarizing films is covered by an inorganic film as a pixel electrode, the water is kept in the planarizing films. Thus, the organic EL characteristics can be degraded after long-term use of the organic EL panel due to damage to the pixel electrodes by the water leaking from the planarizing films.

It is an object of the present invention to suppress degradation in organic EL luminous characteristics due to leakage of water etc. contained in an organic resin of a planarizing film etc. with time.

Solution to the Problem

An organic EL device according to the present invention is an organic EL device having a light-emitting region and a non-light-emitting region located outside the light-emitting region, and including: a substrate; a planarizing film comprised of an organic resin and provided over the substrate so as to cover the light-emitting region and the non-light-emitting region; a first electrode provided on the planarizing film so as to cover at least the light-emitting region; an organic layer provided on the first electrode so as to cover at least the light-emitting region; and a second electrode provided on the organic layer so as to cover the light-emitting region and the non-light-emitting region, wherein a hole is formed in the non-light-emitting region so as to extend from the second electrode to the planarizing film, and at least the planarizing film is exposed by an inner wall surface of the hole.

With the above configuration, the hole extending from the second electrode to the planarizing film is formed in the non-light-emitting region, and at least the planarizing film is exposed by the inner wall surface of the hole. Thus, water contained in the organic resin of the planarizing film is discharged to the outside from the inner wall surface of the hole. This suppresses entrance of the water contained in the organic resin of the planarizing film to the organic film or the electrodes, and thus can suppress degradation in organic EL luminous characteristics by the water contained in the planarizing film.

In the organic EL device of the present invention, it is preferable that the first electrode be provided so as to cover a part of the non-light-emitting region as well, and that the organic EL device further include: an edge cover provided in the non-light-emitting region so as to cover the first electrode and the planarizing film.

In the organic EL device of the present invention, it is preferable that the hole be formed so as to extend through the planarizing film.

With the above configuration, since the hole is formed so as to extend through the planarizing film, the area of the exposed portion of the planarizing film on the inner wall surface of the hole can be increased, and a large flow passage for discharging the water contained in the planarizing film to the outside can be obtained.

In the present invention, it is preferable that the inner wall surface of the hole extend perpendicularly to the substrate.

With the above configuration, the inner wall surface of the hole extends perpendicularly to the substrate. This can suppress adhesion of materials of the organic layer, the second electrode, etc., which are to be formed after formation of the hole, to the inner wall of the hole when forming the organic layer, the second electrode, etc. in the manufacturing process of the organic EL device. As a result, the planarizing film can be reliably exposed by the inner wall of the hole, and a flow passage for discharging the water contained in the planarizing film to the outside can be obtained.

In the present invention, the planarizing film may have a thickness of 2-5 μm.

With the above configuration, since the thickness of the planarizing film is 2 μm or more, flatness and an electrically insulating property of the substrate surface can be sufficiently ensured.

In the organic EL device of the present invention, the planarizing film exposed by the inner wall surface of the hole may be covered by a coating film, which is comprised of a same material as the edge cover and is formed integrally with the edge cover.

In the present invention, the hole may have a circular shape as viewed in plan.

The hole may have a rectangular shape as viewed in plan.

With the above configuration, since the hole has a rectangular shape as viewed in plan, the area of the inner wall surface of the hole can be increased as compared to the case where the hole has a circular shape as viewed in plan, whereby a large flow passage of the water can be obtained.

In the present invention, the planarizing film may be comprised of a polyimide resin or an acrylic resin.

The organic EL device of the present invention may be used in a display application.

Advantages of the Invention

According to the organic EL device of the present invention, the hole extending from the second electrode to the planarizing film is formed in the non-light-emitting region, and at least the planarizing film is exposed by the inner wall surface of the hole. Thus, water contained in the organic resin of the planarizing film is discharged to the outside from the inner wall surface of the hole. This suppresses entrance of the water contained in the organic resin of the planarizing film to the organic film or the electrodes, and thus can suppress degradation in organic EL luminous characteristics by the water contained in the planarizing film.

BRIEF DESCRIPTION OF THE DRAWINGS

[FIG. 1]

[FIG. 2]

[FIG. 3]

[FIG. 4]

[FIG. 5]

[FIG. 6]

[FIG. 7]

[FIG. 8]

DESCRIPTION OF EMBODIMENTS

[First Embodiment]
(Configuration of Organic EL Display Device)

Figure 1:
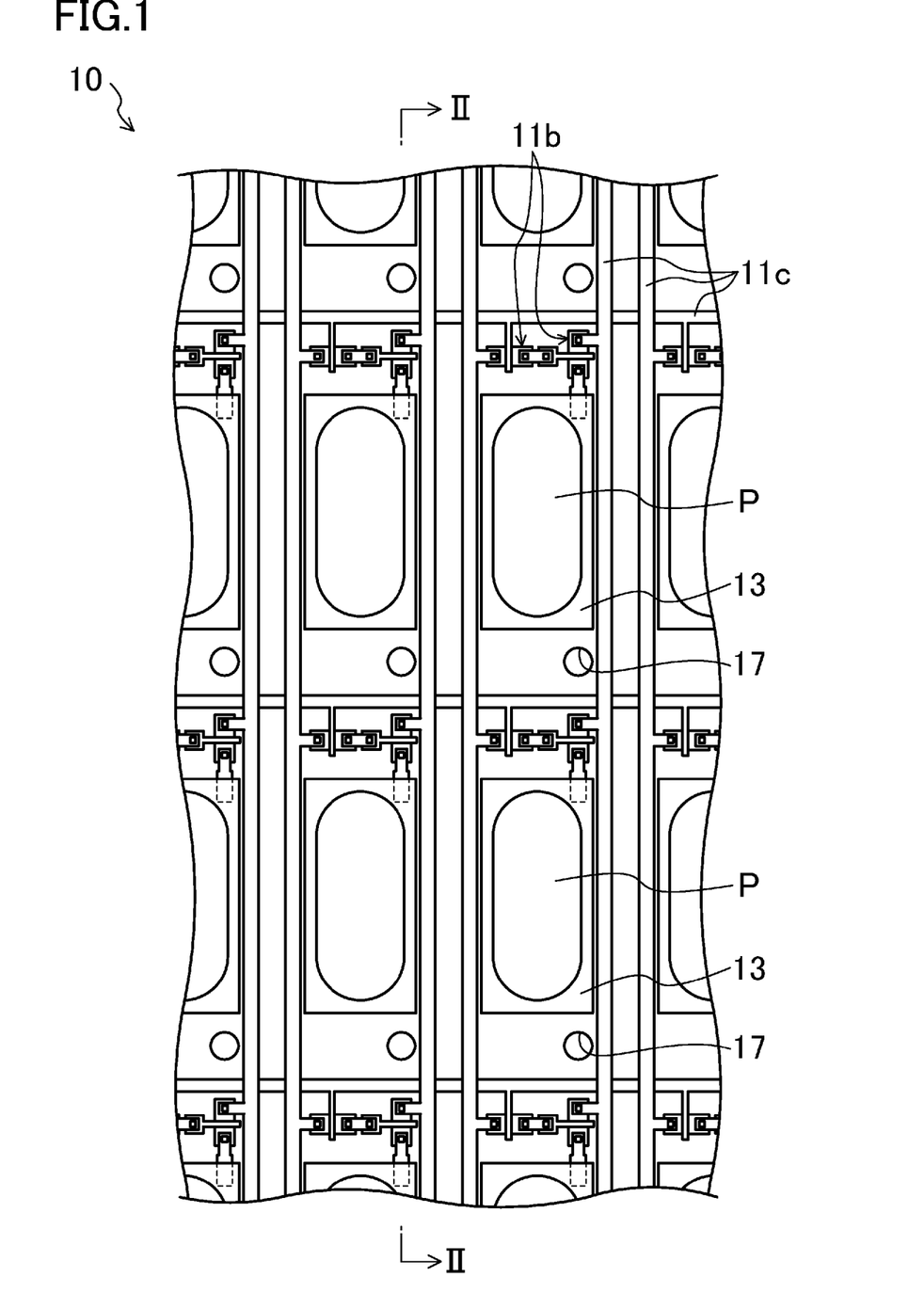
FIG. 1 is a plan view of an organic EL display device according to a first embodiment.
Figure 2:
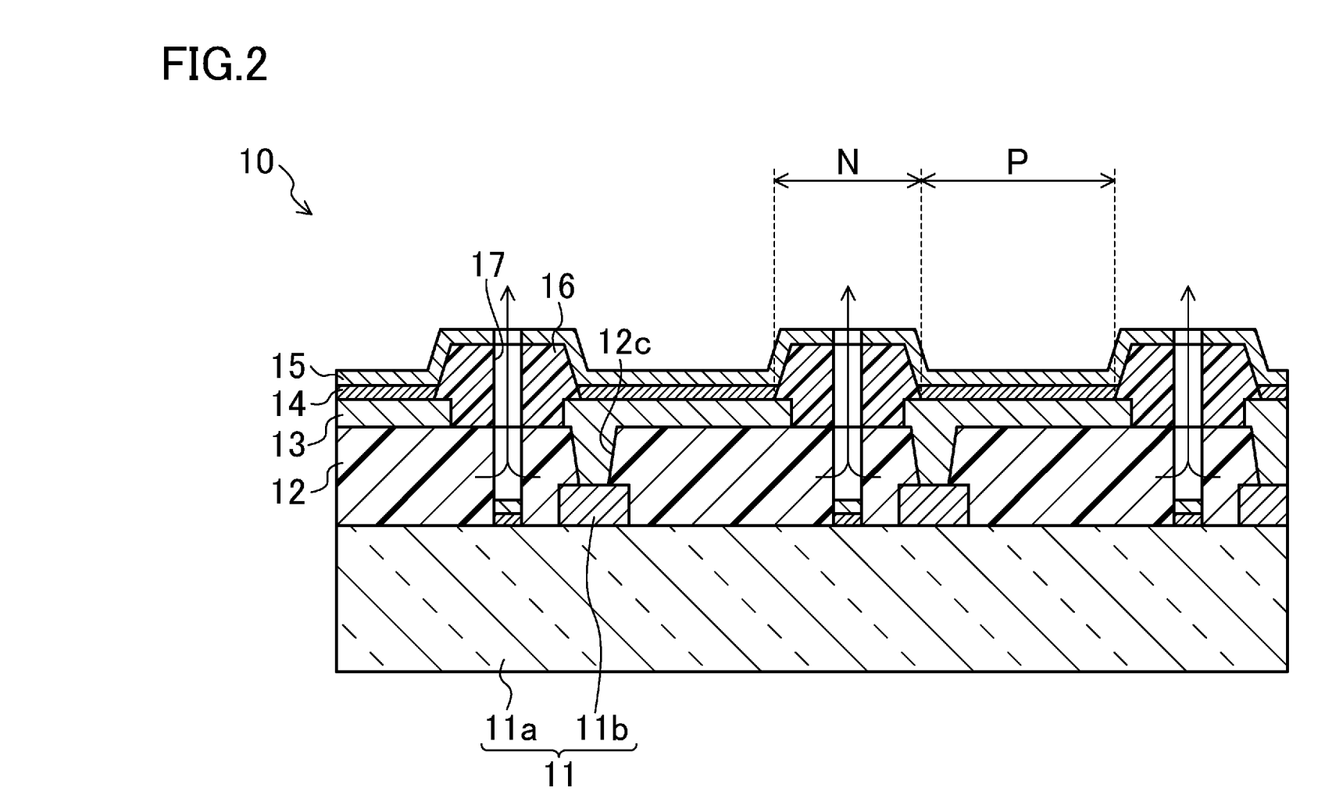
FIG. 2 is a cross-sectional view taken along line II-II in FIG. 1.

FIGS. 1-2 show an organic EL display device 10 of the first embodiment. This organic EL display device 10 is used for, e.g., displays of portable information devices, full-color high-definition televisions, etc.

The organic EL display device 10 is provided so that a substrate such as a TFT substrate 11 faces a sealing member. In each light-emitting region P where the organic EL display device 10 emits light, a planarizing film 12, a first electrode 13, an organic layer 14, and a second electrode 15 are sequentially stacked from the side of the TFT substrate 11 in the space formed between the TFT substrate 11 and the sealing member. The plurality of light-emitting regions P are arranged in a matrix pattern, and these light-emitting regions P are independently driven to display a predetermined image in the light-emitting regions P. A non-light-emitting region N where no light is emitted is formed around each light-emitting region P. In the case where the organic EL display device 10 provides RGB full-color display, the plurality of light-emitting regions P are comprised of three types of light-emitting regions P, namely red light-emitting regions P, green light-emitting regions P, and blue light-emitting regions P. For example, the organic EL display device 10 is 400-500 mm long, 300-400 mm wide, and 1-30 mm thick. For example, each of the light-emitting regions P is about 200 μm long and about 50 μm wide, and the light-emitting regions P are arranged at intervals of about 100 μm in the longitudinal direction and about 50 μm in the lateral direction.

The TFT substrate 11 is configured so that TFTs 11b, interconnects 11c, etc. are formed on a TFT substrate main body 11a. The plurality of TFTs 11b are provided on the TFT substrate main body 11a at predetermined intervals (e.g., at intervals of about 300 μm in the longitudinal direction and about 100 μm in the lateral direction) corresponding to the pitch of the plurality of light-emitting regions P. The planarizing film 12 having an insulating property is formed so as to cover each of the plurality of TFTs 11b.

The TFT substrate main body 11a is, e.g., an insulating substrate such as glass. For example, the TFT substrate main body 11a is about 320 mm long, about 400 mm wide, and about 0.7 mm thick.

Each of the TFTs 11b functions as a switching element in a corresponding one of the light-emitting regions P. The TFTs 11b are comprised of, e.g., an inorganic semiconductor material such as amorphous silicon or polysilicon, etc.

The planarizing film 12 has a function to planarize stepped portions or concaves and convexes in the TFT substrate 11 so that the flat first electrodes 13 can be formed. The planarizing film 12 is comprised of, e.g., a photosensitive organic resin material such as an acrylic resin, a polyimide resin, or a novolak resin. Of these materials, the acrylic resin is preferable because it is inexpensive and is colorless and transparent. In the case where an organic EL panel has a bottom emission structure, the planarizing film 12 is preferably comprised of a light transmitting material such as an acrylic resin because the TFT substrate 11 is required to have a light transmitting property. Contact holes 12c are provided in the planarizing film 12 so as to correspond to the plurality of TFTs 11b, respectively. This allows the surface of the TFT substrate main body 11a to be electrically connected to the TFTs 11b. The planarizing film 12 has a thickness of, e.g., 0.5-5 μm, and is preferably 2 μm or more in order to more reliably ensure its flatness and electrically insulating property.

A TFT substrate having a planarizing film for use in liquid crystal devices may be used as the TFT substrate 11 having its surface covered by the planarizing film 12.

The first electrode 13 is provided in each light-emitting region P so as to have an independent island pattern. Each of the first electrodes 13 is electrically connected to the TFT 11b in a corresponding one of the light-emitting regions P via a corresponding one of the contact holes 12c formed in the planarizing film 12. Although the island pattern of the first electrode 13 need only be formed so as to correspond to at least the light-emitting region P, a part of the island pattern of the first electrode 13 is formed in the non-light-emitting region N surrounding the light-emitting region P. In the non-light-emitting region N, the first electrode 13 is covered by an edge cover 16. That is, a peripheral portion of the island pattern of each first electrode 13 is covered by the edge cover 16, and the islands of adjoining ones of the first electrodes 13 are separated from each other by the edge cover 16. Each of the first electrodes 13 has a thickness of, e.g., about 100 nm.

Each of the first electrodes 13 has a function as an anode to inject holes into the organic layer 14. The anode is comprised of, e.g., an indium oxide-tin oxide alloy (ITO), an indium oxide-zinc oxide alloy ($In_2O_3$—ZnO), zinc oxide (ZnO), etc. In the case where the organic EL display device 10 has a bottom emission structure configured to emit light from the side of the first electrodes 13, the first electrodes 13 are comprised of a light-transmitting or semitransparent material. In the case where the organic EL display device 10 has a top emission structure configured to emit light from the side of the second electrode 15, the first electrodes 13 are comprised of a light reflecting material.

The edge cover 16 is provided on the first electrodes 13 in the non-light-emitting region N so as to cover the periphery of each first electrode 13. In a portion of the non-light emitting region N where the first electrode 13 does not extend, the edge cover 16 is provided on the planarizing film 12. That is, the edge cover 16 is formed so as to separate the islands of the first electrodes 13 in adjoining ones of the light-emitting regions P from each other. This can prevent electrical connection between adjoining ones of the islands of the first electrodes 13. The edge cover 16 is comprised of, e.g., an inorganic insulating material such as silicon dioxide ($SiO_2$), a silicon nitride film ($SiN_x$), a silicon oxide film ($SiO_x$), or a silicon oxynitride film (SiNO), or an organic resin such as an acrylic resin or a polyimide resin. The edge cover 16 has a height of, e.g., 0.5-2 μm.

The edge cover 16 has holes 17 extending from the surface of the edge cover 16 to the planarizing film 12 and extending through the planarizing film 12, and the planarizing film 12 is exposed by the inner wall surfaces of the holes 17. Each of the holes 17 has a function to discharge water contained in the planarizing film 12 into the space in the hole 17 from the exposed portion of the planarizing film 12 on the inner wall surface of the hole 17. Since the space in the hole 17 communicates with the space formed between the TFT substrate 11 and the sealing member, the water discharged into the space in the hole 17 is absorbed by a desiccant or a moisture absorbent provided in the space formed between the TFT substrate 11 and the sealing member.

The opening of each hole 17 has, e.g., a circular shape as viewed in plan. For example, the hole 17 has a depth of about 3 μm and a diameter of about 5 μm. The surface of the TFT substrate 11 may be exposed at the bottom surface of the hole 17, or materials of the organic layer 14 and the second electrode 15 may be deposited on the bottom surface of the hole 17, as described later in the manufacturing method. It is preferable that the wall surface of the hole 17 extend perpendicularly to the TFT substrate 11. This can suppress adhesion of other materials to the inner wall of the hole 17 if they enter the hole 17 through the opening of the hole 17. As a result, the planarizing film 12 can be reliably exposed by the inner wall of the hole 17.

Figure 3:
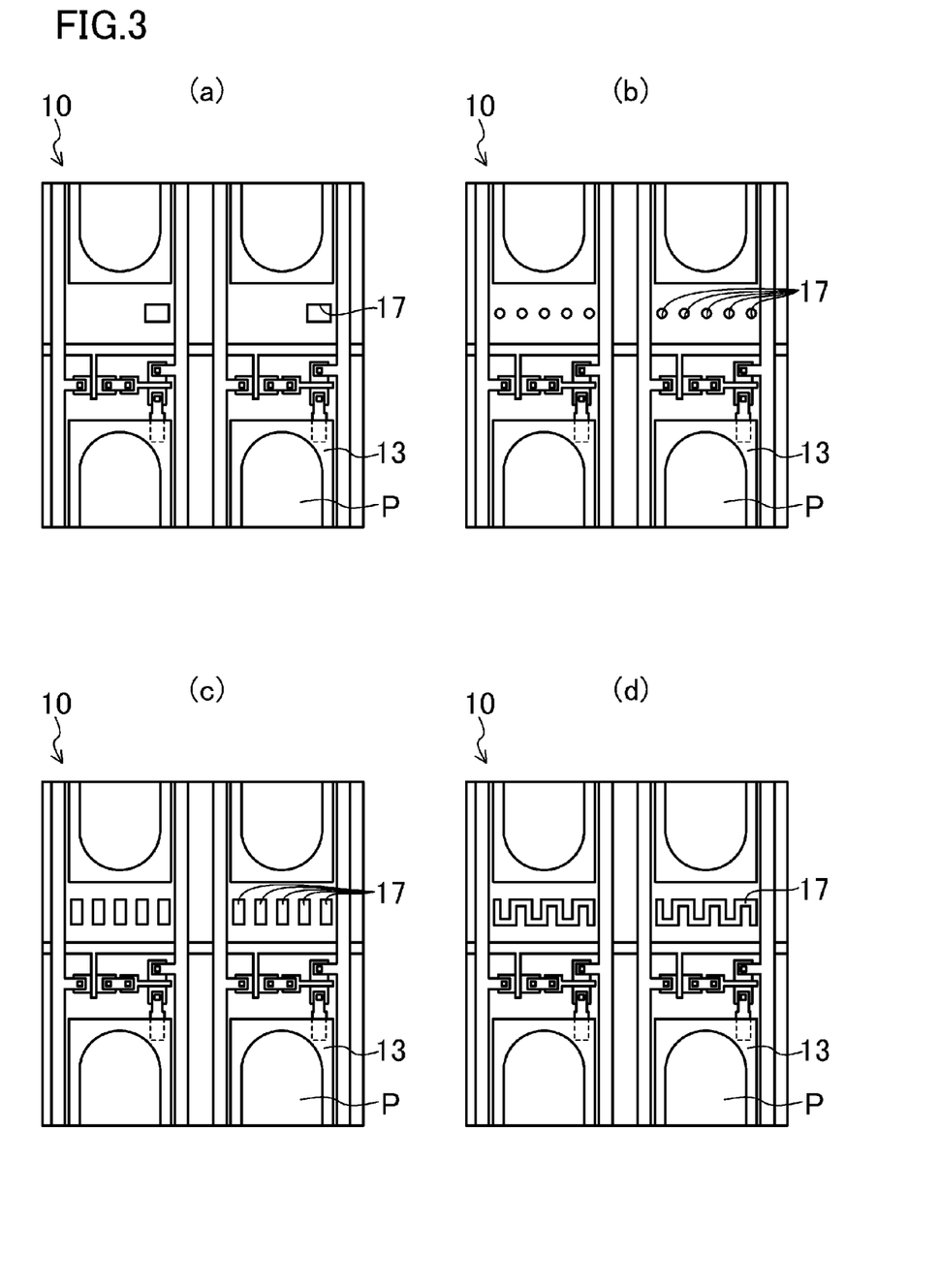
FIGS. 3A-3D are diagrams showing modifications of the shape of holes.

The shape of the hole 17 is not limited to the circular shape as viewed in plan as shown in FIG. 1. For example, the hole 17 may have a rectangular shape, as shown in FIG. 3A. The area of the inner wall surface of the hole 17 serving as a discharge passage of the water can be increased by forming the hole 17 having a rectangular shape as viewed in plan. A plurality of holes 17 may be provided as shown in FIG. 3B or 3C, or the hole 17 may have a meandering shape as shown in FIG. 3D. By increasing the area of the inner wall surface of the hole 17, a larger flow passage for discharging water contained in the organic resin to the outside can be obtained.

The organic layer 14 includes at least a light-emitting layer. A hole injection layer, a hole transport layer, an electron blocking layer, etc. are provided on the hole injection side (the anode side), and an electron injection layer, an electron transport layer, a hole blocking layer, etc. are provided on the electron injection side (the cathode side). The organic layer 14 may have a three-layer structure formed by stacking the hole transport layer, the light-emitting layer, and the electron transport layer, or a five-layer structure formed by stacking the hole injection layer, the hole transport layer, the light-emitting layer, the electron transport layer, and the electron injection layer, or a six-layer structure formed by stacking the hole injection layer, the hole transport layer, the electron blocking layer, the light-emitting layer, the hole blocking layer, and the electron injection layer.

The hole injection layer and the hole transport layer have a function to efficiently inject and transport holes received from the anode to the light-emitting layer. Examples of a hole injection material include copper phthalocyanine (CuPc) etc. Examples of a hole transport material include aromatic tertiary amines such as 4,4'-bis[N-(1-naphtyl)-N-phenylamino] biphenyl (α-NPD). The hole injection layer and the hole transport layer have a thickness of about 30 nm and about 20 nm, respectively.

The light-emitting layer has a function to emit light by recombination of holes and electrons respectively injected from the anode and the cathode in response to voltage application to the first electrode 13 and the second electrode 15. Examples of a light-emitting material include metal oxinoid compounds ((8-hydroxyquinoline) metal complex), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, perylene derivatives, perinone derivatives, rhodamine derivatives, phenoxazone, quinacridone derivatives, rubrene, poly(p-phenylenevinylene), polysilane, etc. The light-emitting layer has a thickness of, e.g., about 20 nm.

The electron injection layer and the electron transport layer have a function to efficiently inject and transport electrons received from the cathode to the light-emitting layer. Examples of an electron transport material include tris(8-quinolinyloxy)aluminum (Alq3) etc. Examples of an electron injection material include lithium fluoride (LiF) etc. The electron transport layer and the electron injection layer have a thickness of about 30 nm and about 1 nm, respectively.

The second electrode 15 is formed so as to cover the entire substrate, namely so as to cover the organic layer 14 in the light-emitting regions P and the edge cover 16 and the film of the organic layer 14 adhering to the edge cover 16 in the non-light-emitting region N. The second electrode 15 has a thickness of, e.g., about 10-200 nm.

The second electrode 15 has a function as a cathode to inject electrons into the organic layer 14. Examples of a material of the cathode include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb), alloys such as lithium fluoride (LiF)/calcium (Ca)/aluminum (Al), etc. In the case where the organic EL display device 10 has a bottom emission structure configured to emit light from the side of the first electrodes 13, the second electrode 15 is comprised of a light-reflecting material. In the case where the organic EL display device 10 has a top emission structure configured to emit light from the side of the second electrode 15, the second electrode 15 is comprised of a light-transmitting or semitransparent material. The organic EL display device 10 may be an organic EL element having an inverted structure in which the first electrodes 13 function as a cathode and the second electrode 15 functions as an anode. In this case, the first electrodes 13 are comprised of a material of the cathode, and the second electrode 15 is comprised of a material of the anode.

The sealing member is, e.g., a substrate comprised of glass etc., and has a desiccant bonded to its surface on the side of the TFT substrate 11 in the non-light-emitting region N. The sealing member is, e.g., 400-500 mm long, 300-400 mm wide, and 0.3-1.1 mm thick.

The TFT substrate 11 is bonded to the sealing member by, e.g., a sealing resin such as an ultraviolet curable resin or a thermosetting epoxy resin. The space sealed by the TFT substrate 11 and the sealing member is filled with inert gas such as dry argon or dry nitrogen.

Polarizers may be provided on the outer surfaces of the TFT substrate 11 and the sealing member, respectively.

(Manufacturing Method of Organic EL Display Device)

A manufacturing method of the organic EL display device 10 according to the first embodiment will be described with reference to FIGS. 4A-4E. The manufacturing method of the organic EL display device 10 includes a planarizing-film formation step, a first-electrode formation step, an edge-cover formation step, a hole formation step, an organic-layer/second-electrode formation step, and a sealing step. Note that the manufacturing method will be described with respect to an example in which the edge cover 16 is comprised of an inorganic insulating material such as $SiO_2$.

Planarizing-Film Formation Step

First, a plurality of TFTs 11b are formed at predetermined intervals on an insulating TFT substrate main body 11a by using a know method, and a planarizing film 12 is formed by using a photolithography technique. Specifically, for example, a substrate having a cleaned surface is coated with an acrylic resin by using a spin coating method, and the resultant substrate is prebaked at about 80° C. for about 20 minutes to form an acrylic resin film. This acrylic resin film is exposed (e.g., about 360 mJ/cm$^2$) by using a photomask, and is developed by using tetramethylammonium hydroxide (TMAH) as a photoresist developer, thereby forming contact holes 12c electrically connected to the TFTs 11b. Each of the contact holes 12c has a diameter of, e.g., 5 μm. Lastly, postbake is performed at about 220° C. for about one hour to form the planarizing film 12.

First-Electrode Formation Step

Figure 4:
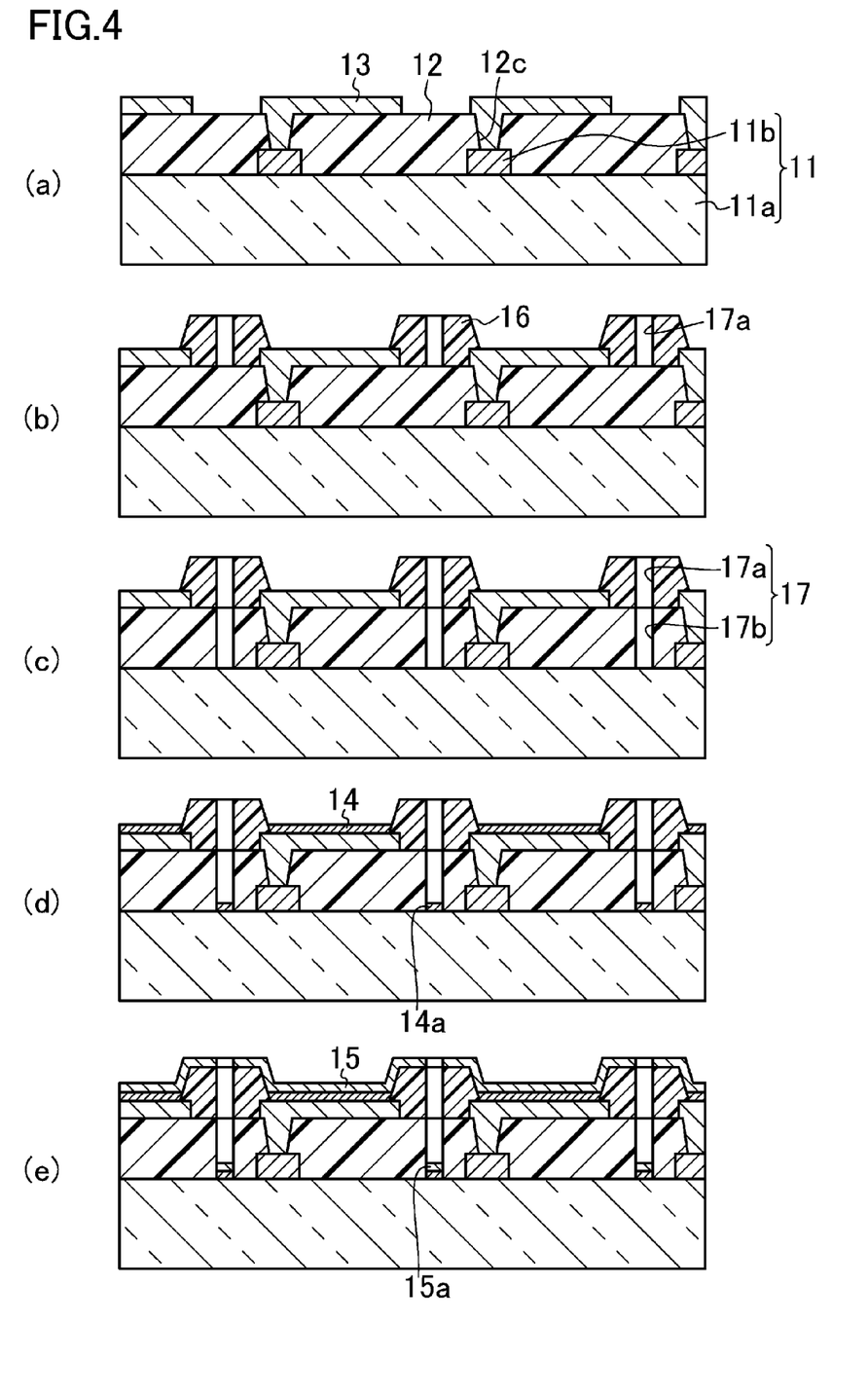
FIGS. 4A-4E are illustrations showing a manufacturing method of the organic EL display device according to the first embodiment.

Next, first electrodes 13 are formed as shown in FIG. 4A. In the case where the first electrodes 13 are comprised of, e.g., ITO, an ITO film having a thickness of about 100 nm is first formed by using a sputtering method, and the first electrodes 13 are formed so as to correspond to pixel regions by using a photolithography technique. At this time, the first electrodes 13 are electrically connected to the TFTs 11b via the contact holes 12c in the planarizing film 12.

Edge-Cover Formation Step

Then, as shown in FIG. 4B, an edge cover 16 is patterned so as to cover peripheral portions of the first electrodes 13 in the non-light-emitting region N. First, an inorganic insulating material (e.g., $SiO_2$) film is formed with a thickness of about 150 nm by using a sputtering method etc. The inorganic insulating material film is exposed and developed by using a photolithography technique, and then is dry etched (e.g., radio frequency (RF) power: 1,000 W, $CF_4/O_2$ gas flow ratio: 425/75 [sccm/sccm], and etching time: 150-200 seconds) to form the edge cover 16 having a predetermined pattern.

The edge cover 16 thus patterned covers the peripheral portions of the first electrodes 13 in the non-light-emitting region N, and has, at predetermined positions in the non-light-emitting region N, holes 17a extending through the edge cover 16 and reaching the planarizing film 12.

Hole Formation Step

Subsequently, as shown in FIG. 4C, the planarizing film 12 is etched by using the pattern of the edge cover 16 having the holes 17a therein as a mask, thereby forming holes 17b extending from the edge cover 16 to the planarizing film 12.

At this time, anisotropically etching the planarizing film 12 by using, e.g., a reactive ion etching (RIE) method etc. allows the resultant holes 17 to have inner wall surfaces extending perpendicularly to a TFT substrate 11. For example, the etching is performed under the following conditions. RF power: about 1,000 W, $O_2$ flow rate: about 300 sccm, bias voltage: about 500 V, and etching time: about 300 seconds. Since the holes 17 having the inner wall surfaces extending perpendicularly to the TFT substrate 11 are formed by using the anisotropic etching, adhesion of other materials to the inner wall surfaces of the holes 17 is suppressed in the manufacturing process after the formation of the holes 17. Thus, the planarizing film 12 can be reliably exposed by the inner walls of the holes 17, and a flow passage for discharging water contained in the planarizing film 12 to the outside can be obtained.

Organic-Layer/Second-Electrode Formation Step

Thereafter, as shown in FIG. 4D, an organic layer 14 is formed by using a know method such as a resistance heating deposition method, an ion beam deposition method, or an inkjet method so that a predetermined organic layer 14 (e.g., an organic layer comprised of a red light-emitting organic EL material) is provided in a predetermined light-emitting region P (e.g., a red light-emitting region). At this time, performance of the organic EL display device is not affected even if the organic layer 14 adheres to the non-light-emitting region N. Moreover, even if the material of the organic layer 14 is stacked on the bottoms of the holes 17 extending from the edge cover 16 to the planarizing film 12, this organic layer 14a does not affect the function of the organic EL element, and the organic layer 14 need not be patterned, whereby the manufacturing process can be simplified.

Then, as shown in FIG. 4E, a second electrode 15 is formed on the organic layer 14 by using a known method such as a sputtering method. At this time, the second electrode 15 is formed over the entire substrate. Like the organic layer 14, even if the material of the second electrode 15 is stacked on the bottoms of the holes 17 extending through both the edge cover 16 and the planarizing film 12, this second electrode 15a does not affect the performance of the organic EL display device, and the second electrode 15 need not be patterned, whereby the manufacturing process can be simplified.

Sealing Step

Lastly, the TFT substrate 11 is placed so as to face a sealing member, and is bonded to the sealing member by using a sealing resin. Note that in the surface of sealing glass located on the side of the TFT substrate 11, a recess is formed in advance in a region that will serve as the non-light-emitting region N, and a desiccant is bonded in advance to the recess.

It is preferable to bond the TFT substrate 11 to the sealing member in a glove box in order to perform this bonding under the conditions of a predetermined water concentration or less and a predetermined oxygen concentration or less. The glove box is filled with, e.g., inert gas such as nitrogen or argon, and the water concentration and the oxygen concentration in the glove box are preferably controlled to 10 ppm or less, and more preferably to 1 ppm or less.

The organic EL display device 10 according to the first embodiment is obtained by the above steps.

(Advantages of First Embodiment)

According to the organic EL display device 10 of the first embodiment, the holes 17 extending from the second electrode 15 to the planarizing film 12 are formed in the non-light-emitting region N, and at least the planarizing film 12 is exposed by the inner wall surfaces of the holes 17. Thus, water contained in the organic resin of the planarizing film 12 is discharged from the inner wall surfaces of the holes 17 to the outside. This suppresses entrance of the water contained in the organic resin of the planarizing film 12 into the organic layer 14 or the electrodes, and thus can suppress degradation in organic EL luminous characteristics by the water contained in the planarizing film 12.

Moreover, forming the holes 17 extending through the planarizing film 12 can increase the area of the exposed surface of the planarizing film 12 in the inner wall surfaces of the holes 17, whereby a large flow passage for discharging the water contained in the planarizing film 12 to the outside can be obtained.

Furthermore, in the manufacturing process of the organic EL display device 10, in the case where the edge cover 16 is comprised of an inorganic insulating material, the holes 17 can be formed by etching the planarizing film 12 by using the pattern of the holes 17a formed in the edge cover 16 as a mask. This can simplify the manufacturing process.

(Second Embodiment)

An organic EL display device 10 according to a second embodiment will be described below. The configurations corresponding to the organic EL display device 10 of the first embodiment are denoted by the same reference characters.

(Configuration of Organic EL Display Device)

Figure 5:
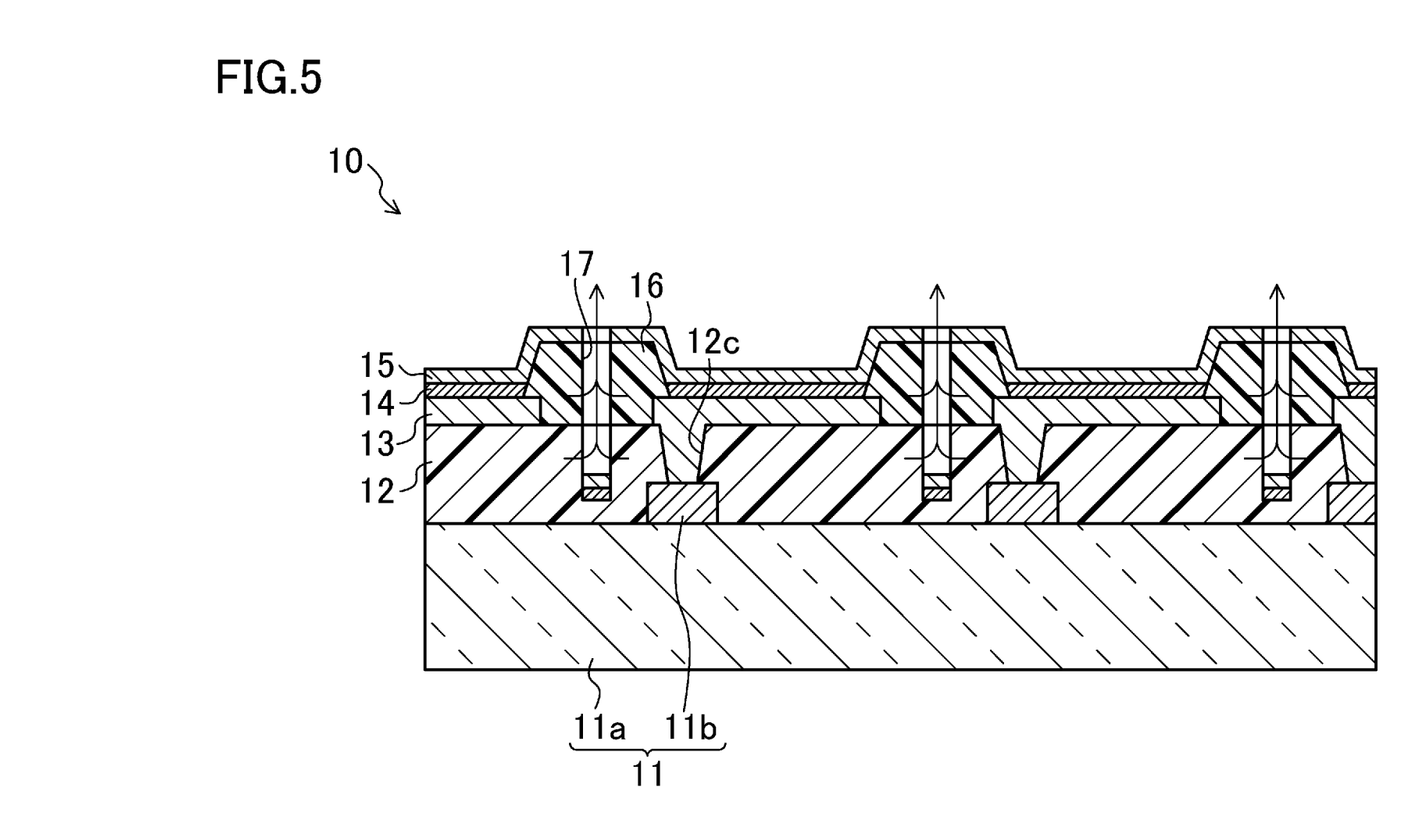
FIG. 5 is a cross-sectional view of an organic EL display device according to a second embodiment.

FIG. 5 shows the organic EL display device 10 according to the second embodiment.

As in the first embodiment, the organic EL display device 10 is configured by sequentially stacking a planarizing film 12, first electrodes 13, an organic layer 14, and a second electrode 15 on a TFT substrate 11.

Since the configurations of the TFT substrate 11, the planarizing film 12, the first electrodes 13, and an edge cover 16 are similar to those of the first embodiment, description thereof will be omitted.

The edge cover 16 has holes 17 extending from the surface of the edge cover 16 to the planarizing film 12, and the planarizing film 12 is exposed by the inner wall surfaces of the holes 17. The holes 17 extend to such a depth that the holes 17 do not extend through the planarizing film 12. Each of the holes 17 has a function to discharge water contained in the planarizing film 12 into the space in the hole 17 from the exposed portion of the planarizing film 12 on the inner wall surface of the hole 17. Since the space in the hole 17 communicates with the space formed between the TFT substrate 11 and a sealing member, the water discharged into the space in the hole 17 is absorbed by a desiccant or a moisture absorbent provided in the space formed between the TFT substrate 11 and the sealing member.

The opening of each hole 17 has, e.g., a circular shape as viewed in plan. For example, the hole 17 has a depth of about 3 μm and a diameter of about 5 μm. The planarizing film 12 may be exposed at the bottom surface of the hole 17, or materials of the organic layer 14 and the second electrode 15 may be deposited on the bottom surface of the hole 17.

Since the configurations of the organic layer 14, the second electrode 15, the sealing member, and the sealing structure between the TFT substrate 11 and the sealing member are also similar to those of the first embodiment, description thereof will be omitted.

(Manufacturing Method of Organic EL Display Device)

A manufacturing method of the organic EL display device 10 according to the second embodiment will be described with reference to FIGS. 6A-6D. As in the first embodiment, this manufacturing method includes a planarizing-film formation step, a first-electrode formation step, an edge-cover formation step, a hole formation step, an organic-layer/second-electrode formation step, and a sealing step. Note that the manufacturing method will be described with respect to an example in which the edge cover 16 is comprised of an organic resin such as $SiO_2$.

Planarizing-Film Formation Step and First-Electrode Formation Step

First, as in the first embodiment, a planarizing film 12 is formed over a TFT substrate 11, and contact holes 12c are formed in the planarizing film 12. Then, a first electrode 13 is patterned in each light-emitting region P so as to be electrically connected to a corresponding one of TFTs 11b.

Edge-Cover Formation Step

Figure 6:
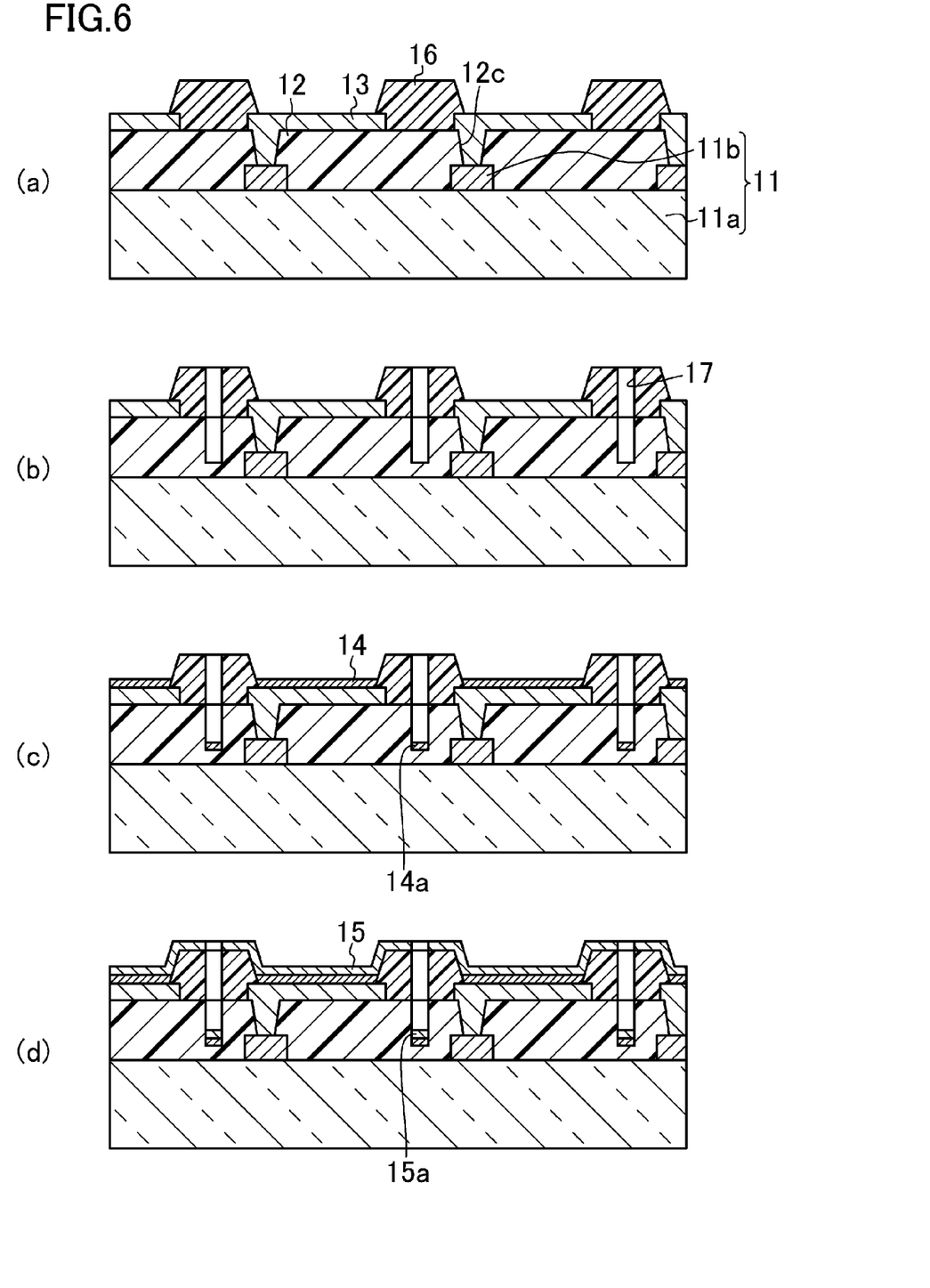
FIGS. 6A-6D are illustrations showing a manufacturing method of the organic EL display device according to the second embodiment.

Next, as shown in FIG. 6A, an edge cover 16 is patterned so as to cover peripheral portions of the first electrodes 13 by, e.g., a photolithography technique using a spin coating method.

Hole Formation Step

Then, as shown in FIG. 6B, by using a mask formed so as to cover the edge cover 16 and the first electrodes 13, the edge cover 16 and the planarizing film 12 are simultaneously etched to form holes 17.

At this time, anisotropically etching the edge cover 16 and the planarizing film 12 by using, e.g., a reactive ion etching (RIE) method etc. allows the resultant holes 17 to have inner wall surfaces extending perpendicularly to the TFT substrate 11. For example, the etching is performed under the following conditions. RF power: about 1,000 W, $O_2$ flow rate: about 300 sccm, bias voltage: about 500 V, and etching time: about 300 seconds. Since the holes 17 having the inner wall surfaces extending perpendicularly to the TFT substrate 11 are formed by using the anisotropic etching, adhesion of other materials to the inner wall surfaces of the holes 17 is suppressed in the manufacturing process after the formation of the holes 17. Thus, the planarizing film 12 can be reliably exposed by the inner walls of the holes 17, and a flow passage for discharging water contained in the planarizing film 12 to the outside can be obtained.

Organic-Layer/Second-Electrode Formation Step and Sealing Step

Thereafter, as shown in FIGS. 6C-6D, an organic layer 14 and a second electrode 15 are sequentially formed as in the first embodiment. Lastly, as in the first embodiment, the TFT substrate 11 is placed so as to face a sealing member, and is bonded to the sealing member by using a sealing resin. The organic EL display device 10 according to the second embodiment is obtained in this manner.

(Advantages of Second Embodiment)

According to the organic EL display device 10 of the second embodiment, the holes 17 extending from the second electrode 15 to the planarizing film 12 are formed in the non-light-emitting region N, and at least the planarizing film 12 is exposed by the inner wall surfaces of the holes 17. Thus, water contained in the organic resin of the planarizing film 12 is discharged from the inner wall surfaces of the holes 17 to the outside. This suppresses entrance of the water contained in the organic resin of the planarizing film 12 into the organic layer 14 or the electrodes, and thus can suppress degradation in organic EL luminous characteristics by the water contained in the planarizing film 12.

Moreover, in the case where the edge cover 16 is comprised of an organic resin, the edge cover 16 also contains water. However, since the holes 17 are formed to extend from the second electrode 15 and through the edge cover 16 to the planarizing film 12, a part of the edge cover 16 is exposed is exposed by the inner wall surfaces of the holes 17. This suppresses entrance of the water contained in the organic resin of the edge cover 16 into the organic layer 14 or the electrodes, and thus can suppress degradation in organic EL luminous characteristics by the water contained in the edge cover 16.

Furthermore, in the manufacturing process of the organic EL display device 10 of the second embodiment, the holes 17 are formed so as to extend to a depth that is shallower than the entire depth of the planarizing film 12 in the hole formation step. This can reduce the etching time required to form the holes 17.

In the case where the edge cover 16 is comprised of an organic resin, the edge cover 16 and the planarizing film 12 can be simultaneously etched in the hole formation step to form the holes 17 extending through the edge cover 16 to the planarizing film 12.

[Third Embodiment]

An organic EL display device 10 according to a third embodiment will be described below. The configurations corresponding to the organic EL display device 10 of the first embodiment are denoted by the same reference characters.

(Configuration of Organic EL Display Device)

Figure 7:
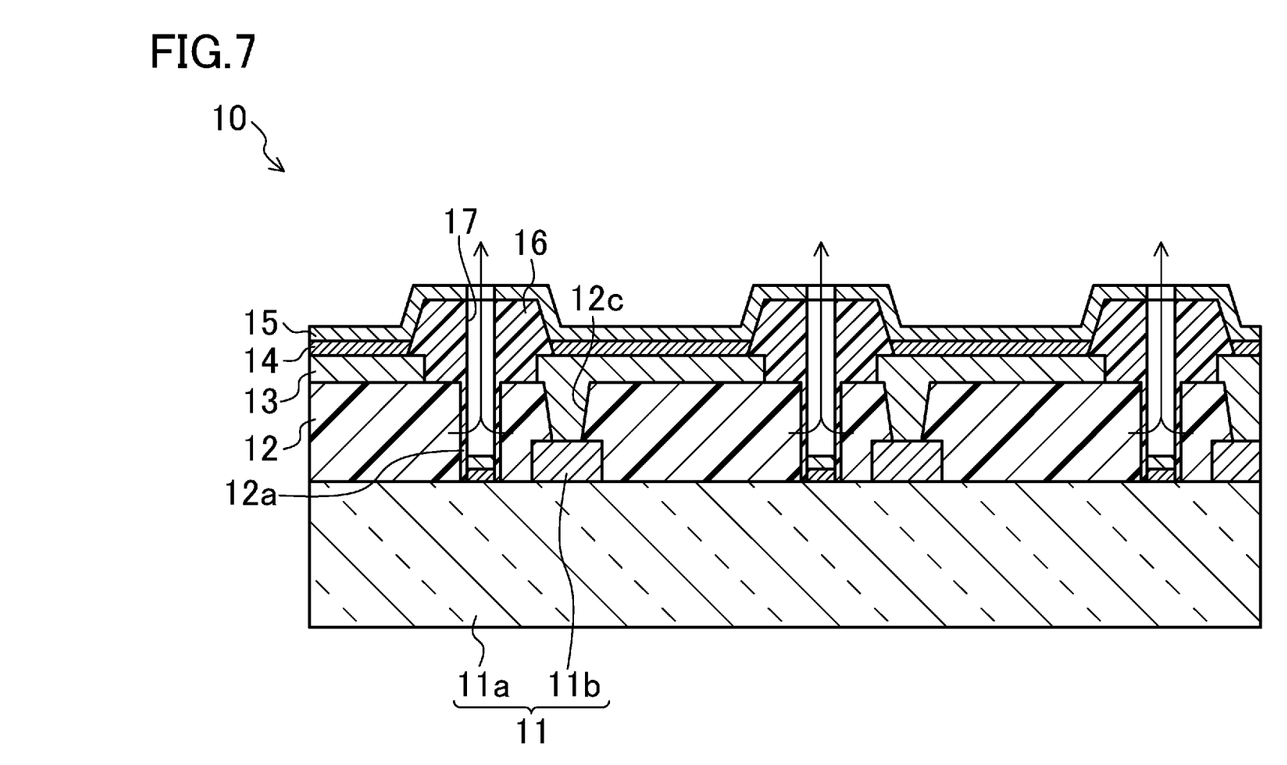
FIG. 7 is a cross-sectional view of an organic EL display device according to a third embodiment.

FIG. 7 shows the organic EL display device 10 according to the third embodiment.

As in the first embodiment, the organic EL display device 10 is configured by sequentially stacking a planarizing film 12, first electrodes 13, an organic layer 14, and a second electrode 15 on a TFT substrate 11.

Since the configurations of the TFT substrate 11, the planarizing film 12, the first electrodes 13, and an edge cover 16 are similar to those of the first embodiment, description thereof will be omitted.

The edge cover 16 has holes 17 extending from the surface of the edge cover 16 to the planarizing film 12 and extending through the planarizing film 12, and the planarizing film 12 is exposed by the inner wall surfaces of the holes 17. A coating film 12a, which is comprised of the same material (e.g., an inorganic insulating material or an organic resin) as the edge cover 16, is formed on the exposed surfaces of the planarizing film 12, and the coating film 12a is integral with the edge cover 16. Each of the holes 17 has a function to discharge water contained in the planarizing film 12 into the space in the hole 17 from the exposed portion of the planarizing film 12 on the inner wall surface of the hole 17. Since the space in the hole 17 communicates with the space formed between the TFT substrate 11 and a sealing member, the water discharged into the space in the hole 17 is absorbed by a desiccant or a moisture absorbent provided in the space formed between the TFT substrate 11 and the sealing member.

The opening of each hole 17 has, e.g., a circular shape as viewed in plan. For example, the hole 17 has a depth of about 3 μm and a diameter of about 5 μm.

The coating film 12a may be formed in the entire exposed portion of the planarizing film 12 on the inner wall surface of each hole 17, or may be formed in a part of the exposed surface of the planarizing film 12 on the inner wall surface of each hole 17. The coating film 12a has a thickness of, e.g., about 200 nm.

Since the configurations of the organic layer 14, the second electrode 15, the sealing member, and the sealing structure between the TFT substrate 11 and the sealing member are also similar to those of the first embodiment, description thereof will be omitted.

(Manufacturing Method of Organic EL Display Device)

A manufacturing method of the organic EL display device 10 will be described with reference to FIGS. 8A-8D. This manufacturing method of the organic EL display device 10 includes a planarizing-film formation step, a first-electrode formation step, a hole formation step, an edge-cover formation step, an organic-layer/second-electrode formation step, and a sealing step.

Planarizing-Film Formation Step and First-Electrode Formation Step

Figure 8:
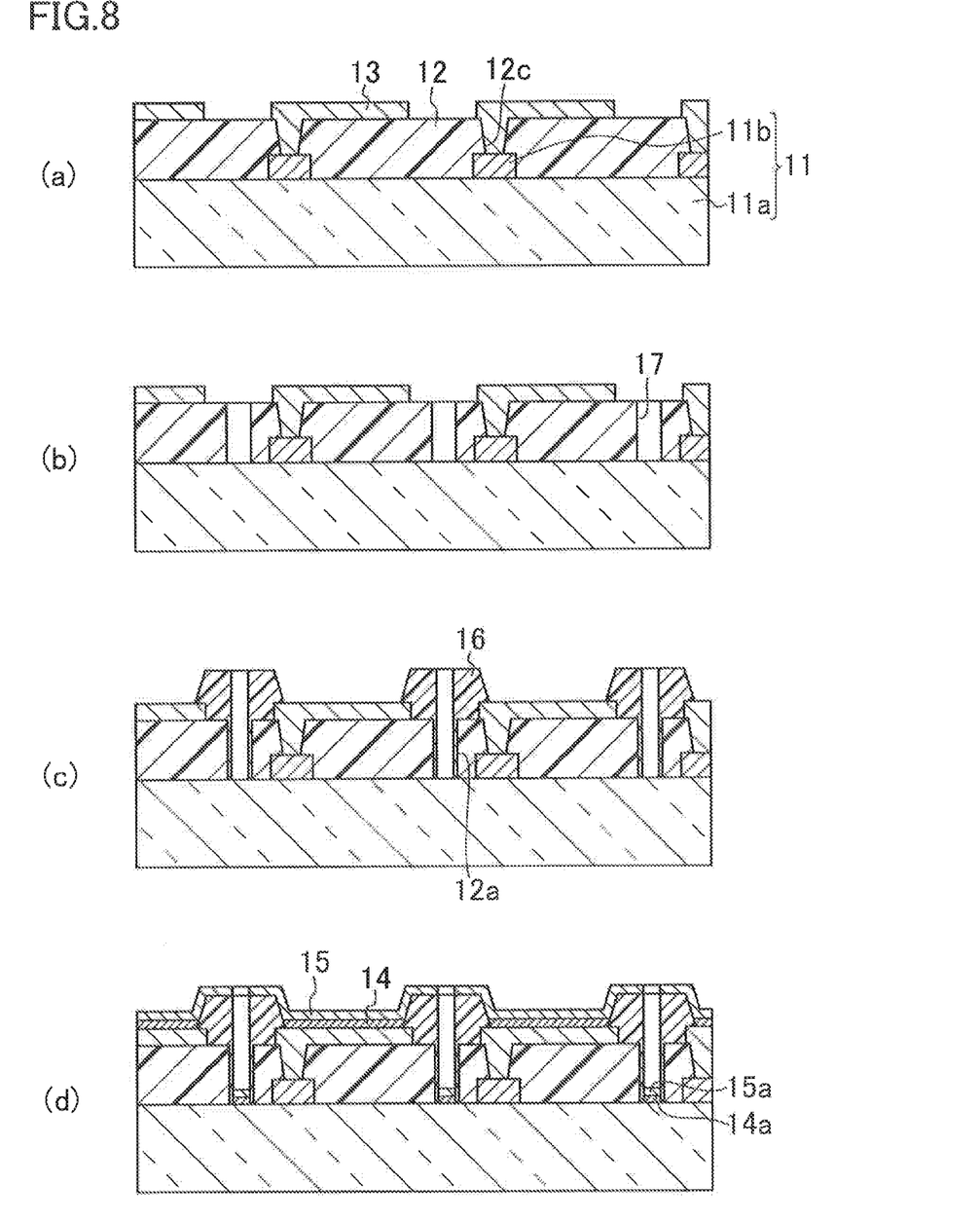
FIGS. 8A-8D are illustrations showing a manufacturing method of the organic EL display device according to the third embodiment.

First, as shown in FIG. 8A, as in the first embodiment, a planarizing film 12 is formed over a TFT substrate 11, and contact holes 12c are formed in the planarizing film 12. Then, a first electrode 13 is patterned in each light-emitting region P so as to be electrically connected to a corresponding one of TFTs 11b.

Hole Formation Step

Next, as shown in FIG. 8B, by using an etching mask having a pattern of holes 17, the planarizing film 12 is etched in a non-light-emitting region N to form the holes 17. At this time, anisotropically etching the planarizing film 12 by using, e.g., a reactive ion etching (RIE) method etc. allows the resultant holes 17 to have inner wall surfaces extending perpendicularly to the TFT substrate 11.

Edge-Cover Formation Step

Next, as shown in FIG. 8C, an edge cover 16 is patterned so as to cover peripheral portions of the first electrodes 13 in the non-light-emitting region N. First, an inorganic insulating material (e.g., $SiO_2$) film is formed with a thickness of about 150 nm by using a sputtering method etc. The inorganic insulating material film is exposed and developed by using a photolithography technique, and then is dry etched (e.g., RF power: 1,000 W, $CF_4/O_2$ gas flow ratio: 425/75 [sccm/sccm], and etching time: 150-200 seconds) to form the edge cover 16 having a predetermined pattern.

At this time, in the sputtering process, a part of the material of the edge cover 16 adheres to the inner wall surfaces of the holes 17 formed in the planarizing film 12, thereby forming a coating film 12a.

Organic-Layer/Second-Electrode Formation Step and Sealing Step

Thereafter, as shown in FIG. 8D, an organic layer 14 and a second electrode 15 are sequentially formed as in the first embodiment. Lastly, as in the first embodiment, the TFT substrate 11 is placed so as to face a sealing member, and is bonded to the sealing member. The organic EL display device 10 according to the third embodiment is obtained in this manner.

(Advantages of Third Embodiment)

According to the organic EL display device 10 of the third embodiment, the holes 17 extending from the second electrode 15 to the planarizing film 12 are formed in the non-light-emitting region N, and at least the planarizing film 12 is exposed by the inner wall surfaces of the holes 17. Thus, water contained in the organic resin of the planarizing film 12 is discharged from the inner wall surfaces of the holes 17 to the outside. This suppresses entrance of the water contained in the organic resin of the planarizing film 12 into the organic layer 14 or the electrodes, and thus can suppress degradation in organic EL luminous characteristics by the water contained in the planarizing film 12.

Moreover, even if the coating film 12a is formed on the inner wall surfaces of the holes 17, the coating film 12a does not hinder discharge of the water from the exposed portions of the planarizing film 12, and the effect of suppressing degradation in organic EL luminous characteristics can be sufficiently achieved.

[Other Embodiments]

Although the first to third embodiments are described with respect to examples in which the organic EL device is an organic EL display device, the present invention is not limited to this, and the organic EL device may be, e.g., an organic EL lighting device etc.

Industrial Applicability

The present invention is useful for organic EL devices such as organic EL display devices.

Description of Reference Characters

P Light-Emitting Region
N Non-Light-Emitting Region
10 Organic EL Display Device (Organic EL Device)
11 TFT Substrate (Substrate)
12 Planarizing Film
12a Coating Film
13 First Electrode
14 Organic Layer
15 Second Electrode
16 Edge Cover
17 Hole

The invention claimed is:

1. An organic EL device having a plurality of light-emitting regions arranged in a matrix pattern and a non-light-emitting region formed around each of the plurality of light-emitting regions, comprising:
a substrate;
a planarizing film comprised of an organic resin and provided over the substrate so as to cover each of the light-emitting regions and the non-light-emitting region;
a first electrode provided on the planarizing film so as to cover at least the light-emitting regions;
an organic layer provided on the first electrode so as to cover at least each of the light-emitting regions, and including at least a light-emitting layer; and
a second electrode provided on the organic layer so as to cover each of the light-emitting regions and the non-light-emitting region, wherein
a hole is formed in the non-light-emitting region so as to extend from the second electrode to the planarizing film, the hole is located between corresponding ones of the light-emitting regions, and at least the planarizing film is exposed by an inner wall surface of the hole.

2. The organic EL device of claim 1, wherein
the first electrode is provided so as to cover a part of the non-light-emitting region as well, the organic EL device further comprising:
an edge cover provided in the non-light-emitting region so as to cover the first electrode and the planarizing film.

3. The organic EL device of claim 1, wherein
the hole is formed so as to extend through the planarizing film.

4. The organic EL device of claim 1, wherein
the inner wall surface of the hole extends perpendicularly to the substrate.

5. The organic EL device of claim 1, wherein
the planarizing film has a thickness of 2-5 μm.

6. The organic EL device of claim 2, wherein
the planarizing film exposed by the inner wall surface of the hole is covered by a coating film, which is comprised of a same material as the edge cover and is formed integrally with the edge cover.

7. The organic EL device of claim 1, wherein
the hole has a circular shape as viewed in plan.

8. The organic EL device of claim 1, wherein
the hole has a rectangular shape as viewed in plan.

9. The organic EL device of claim 1, wherein
the planarizing film is comprised of a polyimide resin or an acrylic resin.

10. The organic EL device of claim 1, wherein
the organic EL device is used in a display application.

* * * * *